(12) United States Patent
Izumi

(10) Patent No.: US 7,148,867 B2
(45) Date of Patent: Dec. 12, 2006

(54) ELECTRONIC APPLIANCE

(75) Inventor: Yoshihiro Izumi, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 209 days.

(21) Appl. No.: 10/386,677

(22) Filed: Mar. 13, 2003

(65) Prior Publication Data

US 2003/0179169 A1    Sep. 25, 2003

(30) Foreign Application Priority Data

Mar. 25, 2002    (JP) .............................. 2002-083947

(51) Int. Cl.
*G09G 3/36*    (2006.01)
(52) U.S. Cl. .......................... 345/87; 345/55; 345/104; 359/296
(58) Field of Classification Search ................ 345/104, 345/55; 359/296
See application file for complete search history.

(56) References Cited

U.S. PATENT DOCUMENTS 5,812,109 A * 9/1998 Kaifu et al. ................ 345/104

6,480,322 B1 * 11/2002 Engler et al. ............... 359/296
2002/0050958 A1 * 5/2002 Matthies et al. .............. 345/55

FOREIGN PATENT DOCUMENTS

| JP | 63-179323 | 7/1988 |
|---|---|---|
| JP | 4-291320 | 10/1992 |
| JP | 2002-275956 | 10/2000 |

* cited by examiner

*Primary Examiner*—Richard Hjerpe
*Assistant Examiner*—Tammy Pham
(74) *Attorney, Agent, or Firm*—Nixon & Vanderhye PC

(57) ABSTRACT

An electronic appliance includes an array of elements and an addressing substrate. The array of elements includes: first and second surfaces opposed to each other; element regions, arranged in matrix between the first and second surfaces and including electrodes; and a first group of terminal electrodes on the second surface, each of which is electrically connected to associated one of the electrodes. The addressing substrate includes: a substrate having a third surface opposed to the second surface; a second group of terminal electrodes on the third surface, each of which is electrically connected to associated one of the terminal electrodes in the first group; and an addressing driver, which transmits or receives a predetermined signal to/from the element regions via the second group of terminal electrodes while addressing the element regions one after another.

20 Claims, 7 Drawing Sheets

ELECTRONIC APPLIANCE

BACKGROUND OF THE INVENTION

1. Field of the Invention

The present invention relates to an electronic appliance and more particularly relates to a display device or a sensor to be driven while addressing a portion of an electronic appliance.

2. Description of the Related Art

Various types of flat-panel displays have recently been developed as display devices for use in consumer electronic appliances including audiovisual systems such as TVs, office automation equipment, and mobile electronic units like cell phones. Among other things, liquid crystal displays (LCDs), which use a liquid crystal material as its display medium, have been remarkably popularized these days because LCDs are lightweight and thickness-reduced display devices with low power dissipation. As a result, the best LCD can now be picked from multiple types according to its intended application.

Examples of those different types include transmission-type LCDs, reflection-type LCDs, and projection-type LCDs. Specifically, a transmission-type LCD includes a backlight behind its LCD panel and allows the viewer to sense the light that has been emitted from the backlight and then transmitted through the LCD panel. A reflection-type LCD includes a reflector on the back surface or inside of its LCD panel and allows the viewer to sense the light that has come externally and has been reflected from the LCD panel. A projection-type LCD (i.e., a liquid crystal projector) projects an image from its LCD panel onto a screen by using a projection lamp and allows the viewer to sense the projected image on the screen.

Flat-panel displays include not only those LCDs but also several other types of electronic display devices that conduct a display operation according to mutually different principles. Examples of those display devices include EL display devices (self-emitting display devices) that use an EL emission layer, toner display devices and electrophoretic display devices aiming at so-called "electronic paper displays", and twisted ball display devices. The toner display devices, electrophoretic display devices and twisted ball display devices are reflective display devices that utilize reflection of externally incoming light.

Although their display principles (or methods) are different, each of these display devices normally conducts a display operation by an active-matrix addressing technique when their required display capacity (i.e., the number of pixels) is relatively large. In active-matrix addressing, an active-matrix substrate (or addressing substrate), on which each pixel is provided with a switching element (or active component), is used to select a specific location to be addressed. A display device that uses such an addressing substrate (or active-matrix substrate) is described in detail in "Liquid Crystal Display Technologies for Active-Matrix LCDs", edited by Shoichi Matsumoto, Sangyo Tosho Kabushiki Kaisha (publisher of books on industrial technologies), Nov. 8, 1996.

FIG. 8 schematically illustrates the cross-sectional structure of a typical known liquid crystal display device 400. Only the LCD panel portion of the device 400 is shown in FIG. 8 and the illustration of the backlight, polarizers, peripheral drivers, power supply and other members thereof is omitted for the sake of simplicity.

As shown in FIG. 8, the liquid crystal display device 400 includes a pair of substrates 62 and 71 and a liquid crystal layer 63, which is sandwiched between the substrates 62 and 71. The substrates 62 and 71 are typically glass substrates. The liquid crystal layer 63 is formed by sealing the gap between the substrates 62 and 71 with a seal member 69. On the surface of the substrate 71, gate lines 74, source lines 75, switching elements (typically TFTs) 76 and pixel electrodes 73 are provided so as to face the liquid crystal layer 63. Each of the pixel electrodes 73 is connected to associated one of the source lines 75 by way of associated one of the switching elements 76. On the surface of the other substrate 62, a counter electrode 64 is provided so as to face the liquid crystal layer 63. If necessary, alignment films and/or a color filter layer may be provided for these substrates 62 and 71.

This liquid crystal display device 400 may be driven in the following manner. Specifically, a number of switching elements 76 on the same row are selectively turned ON responsive to a gate signal that has been supplied through one of the gate lines 74. Then, a predetermined display signal (or gray-scale signal) is supplied through one of the source lines 75 to the pixel electrode 73 that is connected to one of the ON-state switching elements 76. That is to say, multiple pixels, which are arranged in matrix (or in columns and rows) for the respective pixel electrodes 73, are addressed one gate line 74 after another by a line sequential technique. A common voltage is applied to the counter electrode 64. A voltage corresponding to a potential difference between the addressed (or selected) one of the pixel electrodes 73 and the counter electrode 64 is applied to a portion of the liquid crystal layer 63 corresponding to the pixel selected. Liquid crystal molecules in the liquid crystal layer 63 exhibit optically anisotropic properties, i.e., change their orientation directions with the voltage applied thereto. By utilizing this phenomenon, the incoming light is modulated by the liquid crystal molecules while being transmitted through the liquid crystal layer 63. In this manner, the liquid crystal display device 400 conducts a display operation.

There are other types of active-matrix-addressed liquid crystal display devices. For example, a so-called "counter source" type liquid crystal display device is also known in the art. In the "counter source" type liquid crystal display device, a common voltage is applied to the pixel electrodes and a display signal is supplied to multiple counter electrodes, which are provided as a parallel striped arrangement of source lines.

The active-matrix-addressed liquid crystal display device can certainly display an image of quality but is still relatively expensive.

This is partly because a huge number of switching elements should be provided for the addressing substrate. Also, in the conventional structure shown in FIG. 8, the addressing substrate may cause a failure even after the addressing substrate is complete. For example, defects may be produced in the process step of bonding the two substrates 62 and 71 together or in the process step of injecting a liquid crystal material into the gap. In such an undesirable situation, the production yield of liquid crystal display devices decreases while the manufacturing cost thereof increases.

Furthermore, it is an increasingly pressing worldwide demand to contribute to the protection of global environments by utilizing or recycling the materials and components as efficiently as possible. In the conventional liquid crystal display device 400 shown in FIG. 8, however, the substrates 62 and 71 are strongly adhered together with the seal member 69. Accordingly, it is difficult to separate and recycle only the addressing substrates 71, for example.

The active-matrix-addressed liquid crystal display device has these problems but organic EL display devices and other types of display devices also have similar problems. Likewise, these problems are also shared by other sensors and input devices that use an addressing substrate, not just the display devices. That is to say, these are problems to be commonly encountered in any of various types of electronic appliances that are designed to drive an array of elements by using an addressing substrate. As used herein, the "array of elements" normally refers to an array of display area units (or pixels) but may also mean an array of capacitance sensors. Also, although the conventional liquid crystal display device 400 is addressed by a line sequential technique, a point sequential technique may also be used as an alternative addressing technique. Furthermore, the addressing technique is not necessarily an electrical one but may also be an optical one.

SUMMARY OF THE INVENTION

In order to overcome the problems described above, an object of the present invention is to increase the production yield and/or recyclability of electronic appliances that are designed to drive an array of elements by using an addressing substrate.

An electronic appliance according to a preferred embodiment of the present invention preferably includes an array of elements and an addressing substrate. The array of elements preferably includes: a first surface and a second surface, which are opposed to each other; element regions, which are arranged in matrix between the first and second surfaces and which include electrodes; and a first group of terminal electrodes, which is provided on the second surface and each of which is electrically connected to associated one of the electrodes. The addressing substrate includes: a substrate, which has a third surface opposed to the second surface of the array of elements; a second group of terminal electrodes, which is provided on the third surface and each of which is electrically connected to associated one of the terminal electrodes in the first group; and an addressing driver, which transmits or receives a predetermined signal to/from the element regions by way of the second group of terminal electrodes while addressing the element regions one after another.

In one preferred embodiment of the present invention, the array of elements is preferably attachable to, and removable from, the addressing substrate.

In another preferred embodiment, the electronic appliance may further include an anisotropic conductive layer between the first and second groups of terminal electrodes.

In still another preferred embodiment, the second surface may be defined by an anisotropic conductive layer, and portions of the anisotropic conductive layer may function as the electrodes and as the first group of terminal electrodes.

In yet another preferred embodiment, the first and second groups of terminal electrodes may have mutually engaging structures.

In yet another preferred embodiment, the electronic appliance may further include a seal member to maintain a reduced-pressure state in a gap between the array of elements and the addressing substrate.

In yet another preferred embodiment, the element regions may be pixels, the electrodes may be pixel electrodes that are arranged in matrix, the first and second groups of terminal electrodes may also be arranged in the same matrix as the pixel electrodes, and the array of elements may function as a display device in response to the predetermined signal to be transmitted from the addressing driver.

In this particular preferred embodiment, the addressing substrate preferably includes a circuit for generating multiple reference voltages and multiple gray-scale voltages associated with the reference voltages.

Alternatively or additionally, the addressing substrate preferably includes a plurality of switching elements, each of which is connected to associated one of the terminal electrodes in the second group.

In yet another preferred embodiment, the pixels may include a liquid crystal layer.

In yet another preferred embodiment, the pixels may include an organic EL emission layer.

In yet another preferred embodiment, the addressing substrate preferably includes a plurality of switching elements, each of which is connected to associated one of the terminal electrodes in the second group. Each of the switching elements preferably includes a semiconductor layer that changes the conductivity thereof when exposed to light. In that case, the addressing substrate is operable as an array of photosensors separately from the array of elements.

In yet another preferred embodiment, the element regions may include the electrodes and an insulating layer that covers the electrodes, and may form a capacitance between the electrodes and an object that is located over the electrodes with the insulating layer interposed between them. In that case, the array of elements may function as an array of capacitance sensors for transferring electric charge, which has been stored on the electrodes, to the addressing substrate in response to the signal that has been transmitted from the addressing substrate.

In this particular preferred embodiment, the electrodes are preferably arranged in matrix, the first and second groups of terminal electrodes are preferably also arranged in the same matrix as the electrodes, and the addressing substrate preferably includes a plurality of switching elements, each of which is connected to associated one of the terminal electrodes in the second group.

More particularly, each of the switching elements preferably includes a semiconductor layer that changes the conductivity thereof when exposed to light. Then, the addressing substrate is operable as an array of photosensors separately from the array of elements.

An electronic appliance according to another preferred embodiment of the present invention preferably includes a display medium substrate and an optical addressing substrate. The display medium substrate preferably includes: a first electrode and a second electrode, which are opposed to each other; a display medium layer, which is provided between the first and second electrodes; and a photo-conductive layer, which is provided between the second electrode and the display medium layer. The optical addressing substrate is preferably provided so as to face the second electrode of the display medium substrate and preferably includes a plurality of light-emitting elements. The electronic appliance preferably sequentially addresses each predetermined region of the display medium layer with light that has been emitted from the light-emitting elements, and preferably conducts a display operation with a voltage applied from the first and second electrodes.

In one preferred embodiment of the present invention, the display medium substrate preferably further includes a reflective layer between the photo-conductive layer and the display medium layer. In that case, the electronic appliance preferably conducts a display operation by getting light, which has externally entered the display medium layer, reflected by the reflective layer.

In this particular preferred embodiment, the display medium substrate preferably includes a transmitting region, which is not covered with the reflective layer or the second electrode. In that case, the electronic appliance may conduct a display operation with light that has been emitted from the light-emitting elements and then transmitted through the transmitting region.

In still another preferred embodiment, the display medium substrate is preferably attachable to, and removable from, the optical addressing substrate.

In yet another preferred embodiment, the electronic appliance preferably further includes an optical element between the display medium substrate and the optical addressing substrate. The optical element preferably controls the distribution of the light that has been emitted from the light-emitting elements.

In yet another preferred embodiment, the electronic appliance preferably further includes a seal member that maintains a reduced-pressure state in a gap between the display medium substrate and the optical addressing substrate.

In yet another preferred embodiment, the light-emitting elements are preferably arranged in matrix and provided for respective pixels.

In this particular preferred embodiment, the optical addressing substrate preferably functions as a display device separately from the display medium substrate.

In yet another preferred embodiment, the display medium layer may be a liquid crystal layer.

In yet another preferred embodiment, the light-emitting elements may be organic EL emitting elements.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 1A, 1B and 1C schematically illustrate the structure of a liquid crystal display device 100 according to a first specific preferred embodiment of the present invention, wherein:

FIG. 1A is an exploded cross-sectional view of the display device 100;

FIG. 1B is a cross-sectional view of the complete display device 100; and

FIG. 1C is a plan view of the display device 100.

FIGS. 2A and 2B schematically illustrate the structure of another liquid crystal display device 110 according to the first preferred embodiment, wherein:

FIG. 2A is an exploded cross-sectional view of the display device 110; and

FIG. 2B is a cross-sectional view of the complete display device 110.

FIGS. 3A, 3B and 3C schematically illustrate the structure of still another liquid crystal display device 120 according to the first preferred embodiment, wherein:

FIG. 3A is an exploded cross-sectional view of the display device 120;

FIG. 3B is an enlarged cross-sectional view of one pixel portion of the display device 120; and FIG. 3C is a perspective view illustrating the structure of an anisotropic conductive sheet.

FIGS. 6A, 6B and 6C show the structure and function of a sensor 300 according to a third specific preferred embodiment of the present invention, wherein:

FIG. 6A is a cross-sectional view of the sensor 300;

FIG. 6B is a plan view of the sensor 300; and

FIG. 6C shows how the sensor 300 operates.

DETAILED DESCRIPTION OF PREFERRED EMBODIMENTS

Hereinafter, preferred embodiments of an electronic appliance according to the present invention will be described with reference to the accompanying drawings. It should be noted, however, that the present invention is in no way limited to the following specific preferred embodiments.

An electronic appliance according to a preferred embodiment of the present invention preferably includes: an array of elements, which includes element regions that are arranged in matrix; and an addressing substrate, which can drive the array of elements while addressing the element regions thereof.

The array of elements preferably includes: a first surface and a second surface, which are opposed to each other; element regions, which are arranged in matrix between the first and second surfaces and which include electrodes; and a first group of terminal electrodes, which is provided on the second surface and each of which is electrically connected to associated one of the electrodes.

The addressing substrate preferably includes: a substrate, which has a third surface opposed to the second surface of the array of elements; a second group of terminal electrodes, which is provided on the third surface and each of which is electrically connected to associated one of the terminal electrodes in the first group; and an addressing driver, which transmits or receives a predetermined signal to/from the element regions by way of the second group of terminal electrodes while addressing the element regions one after another.

In the electronic appliance according to this preferred embodiment of the present invention, the first and second groups of terminal electrodes for use to electrically connect the array of elements and the addressing substrate together are provided on two different surfaces (of two different substrates or films). Thus, the array of elements is easily separable from the addressing substrate. As a result, the present invention contributes to increasing the production yield and/or recyclability of electronic appliances.

Embodiment 1

Hereinafter, a first specific preferred embodiment of the present invention will be described. The first preferred embodiment of the present invention is applied to a display device.

Figure 1A:
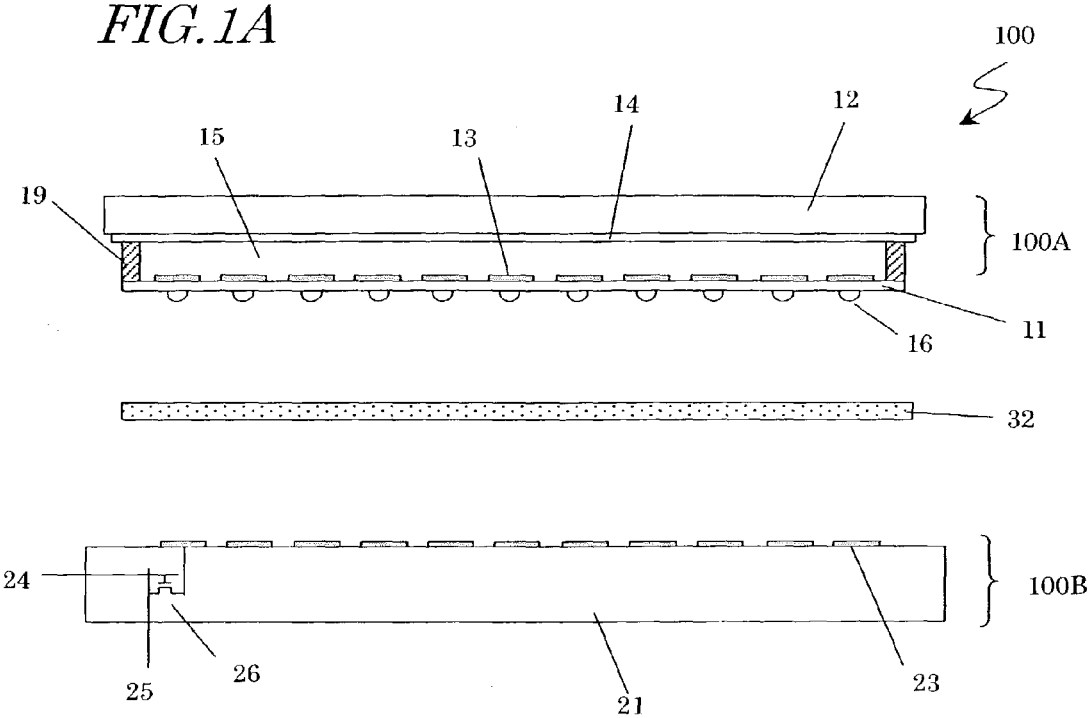
Figure 1B:
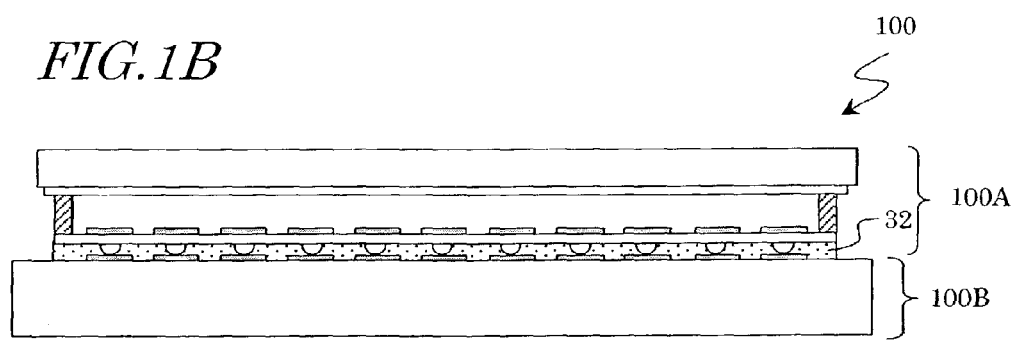
Figure 1C:
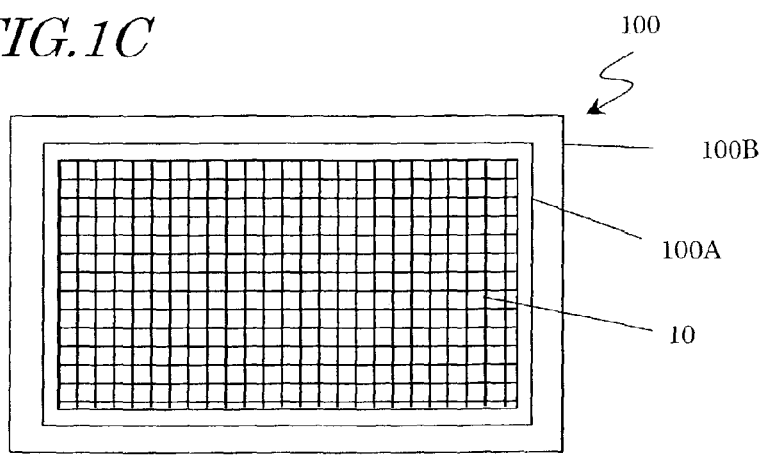

FIGS. 1A, 1B and 1C schematically illustrate the structure of a liquid crystal display device 100 according to a first preferred embodiment of the present invention. Specifically, FIG. 1A is an exploded cross-sectional view of the display device 100, FIG. 1B is a cross-sectional view of the complete display device 100, and FIG. 1C is a plan view of the display device 100. In FIGS. 1A, 1B and 1C, the illustration of the backlight, polarizers, peripheral drivers, power supply and other members of the display device 100 is omitted for the sake of simplicity.

The liquid crystal display device 100 includes an LCD panel 100A as an exemplary array of elements, and an addressing substrate 100B.

As shown in FIG. 1A, the LCD panel 100A includes a connector substrate 11, a counter substrate 12, and a liquid crystal layer 15, which is sandwiched between the connector substrate 11 and the counter substrate 12. The liquid crystal layer 15 is sealed with a seal member 19. The connector substrate 11 and the counter substrate 12 are insulating substrates such as glass substrates or plastic substrates.

On the surface of the connector substrate 11, multiple pixel electrodes 13 are arranged in matrix so as to face the liquid crystal layer 15. The pixel electrodes 13 may be formed by patterning an ITO film, for example. A counter electrode 14 is provided on the surface of the counter substrate 12 so as to face the liquid crystal layer 15 also. Optionally, a color filter layer and a black matrix may be additionally provided for these substrates 11 and 12.

No gate lines, source lines or switching elements are provided on the connector substrate 11 of the LCD panel 100A. Thus, the pixel electrodes 13 are electrically isolated from each other.

On the back surface of the connector substrate 11, a first group of terminal electrodes 16, each of which is electrically connected to associated one of the pixel electrodes 13, is provided so as not to face the liquid crystal layer 15. The first group of terminal electrodes 16 is arranged in the same matrix as the pixel electrodes 13. As shown in FIG. 1A, the first group of terminal electrodes 16 may be bump electrodes that protrude from the back surface of the connector substrate 11. For example, the first group of terminal electrodes 16 may be made of a metal material such as Ni, Cu, Sn or solder. The pixel electrodes 13 and the first group of terminal electrodes 16 may be electrically connected together by way of contact holes (not shown) to be provided through the connector substrate 11. The contact holes may be formed by any known technique such as an etching process.

A connector electrode to be electrically connected to the counter electrode 14 by an electrode transfer technique (which electrode will be referred to herein as a "transfer electrode"), as well as the pixel electrodes 13, may be provided on the same surface of the connector substrate 11 so as to face the liquid crystal layer 15. In that case, another terminal electrode, which should also belong to the first group, may be provided so as to be electrically connected to the connector electrode for the counter electrode 14. The electrode transfer technique may be carried out by a known method that uses carbon paste, metal paste or metal particles.

The addressing substrate 100B includes gate lines 24, source lines 25, TFTs 26 and pixel electrodes 23 (which will also be referred to herein as a "second group of terminal electrodes") on a substrate 21. Each of the pixel electrodes 23 is connected to its associated source line 25 by way of its associated TFT 26. Although not shown specifically in FIG. 1A, the gate lines 24 and source lines 25 are provided between the pixel electrodes 23 that are arranged in matrix, and one of the TFTs 26 is located near each of the pixel electrodes 23. A gate line driver (not shown in FIG. 1C) to supply a gate signal through the gate lines 24 and a source line driver (not shown in FIG. 1C) to supply a data signal through the source lines 25 are further provided on the substrate 21 (see FIG. 6B). These drivers will be sometimes referred to herein as "addressing drivers" collectively.

Figure 8:
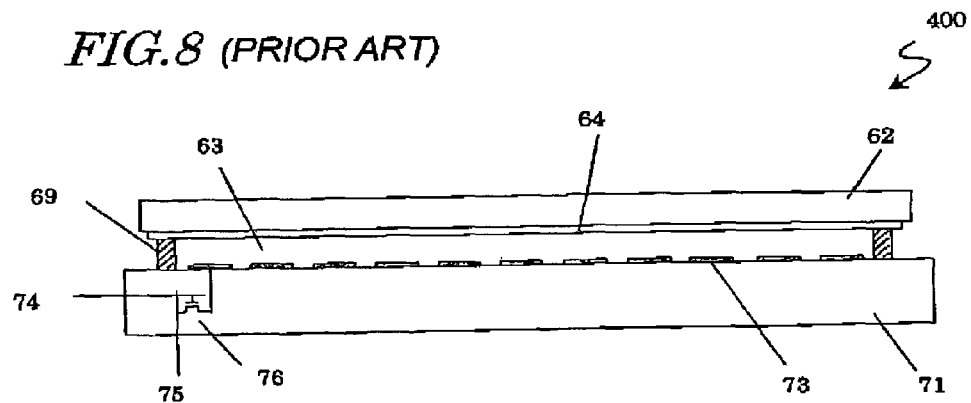
FIG. 8 is a cross-sectional view schematically illustrating the structure of a conventional liquid crystal display device 400.

The substrate 21 may be either an insulating substrate (e.g., a glass substrate or a plastic substrate) or a semiconductor substrate (e.g., a silicon substrate). The gate lines 24 and source lines 25 may be formed by patterning a metal film of Al, Ta, Mo or Cu or a conductive oxide film of ITO, for example. The TFTs 26 may include an active layer of Si or an organic semiconductor. The pixel electrodes 23 may also be formed by patterning a metal film of Al, Ta, Mo or Cu or a conductive oxide film of ITO, for example. The addressing substrate 100B may have the same basic structure as the active-matrix substrate of a conventional liquid crystal display device (e.g., the liquid crystal display device 400 shown in FIG. 8).

However, the pixel electrodes 23 need to be electrically connected to the first group of terminal electrodes 16 of the LCD panel 100A. Accordingly, if an insulating layer (not shown) is provided as a protective coating for the gate lines 24, source lines 25 and TFTs 26, then the pixel electrodes 23 should be exposed on the insulating layer. In that case, the pixel electrodes 23 function as a second group of terminal electrodes to be electrically connected to the first group of terminal electrodes 16. Alternatively, even if the pixel electrodes 23 are covered with the insulating layer, a second group of terminal electrodes (not shown) may be separately provided so as to be electrically connected to the pixel electrodes 23 by way of contact holes that run through the insulating layer.

The first group of terminal electrodes 16 of the LCD panel 100A may be electrically connected to the pixel electrodes (or second group of terminal electrodes) 23 of the addressing substrate 100B with an anisotropic conductive layer 32, for example. In that case, the LCD panel 100A and the addressing substrate 100B need to be positioned with respect to each other and bonded together in such a manner that the first group of terminal electrodes 16 of the LCD panel 100A is not misaligned from the pixel electrodes (or the second group of terminal electrodes) 23 of the addressing substrate 100B. If the anisotropic conductive layer 32 has adhesiveness, then the LCD panel 100A and the addressing substrate 100B may be adhered and secured together with the anisotropic conductive layer 32. The anisotropic conductive layer 32 may be a known anisotropic conductive film (ACF) or anisotropic conductive paste (ACP), which exhibits electrical conductivity only perpendicularly to its layer surface.

The anisotropic conductive layer 32 may be made of a sheet or paste of a resin material in which conductive particles are dispersed. Examples of preferred conductive particles include: metal particles of Au plated with Ni, for example; carbon particles; plastic particles plated with Ni and Au, for example; and plastic (e.g., polyurethane) particles including transparent conductive particles of ITO or Ni particles, for example. Examples of preferred resin materials include epoxy resins, acrylic resins, polyurethane styrene-butadiene-styrene block copolymers (SBS), styrene-ethylenebutylene-styrene block copolymers (SEBS) and polyvinyl butyrals (PVB).

It should be noted that if a thermoplastic resin, which softens when heated, or a UV-decomposable resin, which loses its adhesive strength when exposed to an ultraviolet ray, is used as the resin material, even the LCD panel 100A and addressing substrate 100B that have once been bonded together are easily separable from each other depending on the necessity. Even so, the LCD panel 100A and the addressing substrate 100B may be re-bonded together with the same anisotropic conductive layer after the bond surfaces thereof have been cleaned with a solvent such as an alcohol. If the LCD panel 100A and addressing substrate 100B are easily attachable and removable (or bondable and separable) to/from each other in this manner, the user can replace the LCD panel 100A at any time to satisfy his or her needs.

This liquid crystal display device 100 may be driven by the conventional method, and the detailed description thereof will be omitted herein.

This liquid crystal display device 100 has such a structure as allowing the user to remove the LCD panel 100A from the addressing substrate 100B easily. Thus, the user can replace the LCD panel 100A any time as the need arises. For example, the LCD panel 100A may be replaced with a good one when the LCD panel 100A goes defective or with an alternative panel that meets the user's demand more appropriately. In that latter case, the existent panel may be replaced with a reflective panel, a transmissive panel, or a panel having a different viewing angle characteristic or a different response speed. Furthermore, if necessary, the existent LCD panel may also be replaced with a different type of display panel such as an organic EL display panel.

To make the LCD panel 100A replaceable with another LCD panel, the addressing substrate 100B preferably includes a circuit for generating a number of reference voltages and the same number of gray-scale voltages that are associated with the respective reference voltages. In that case, the addressing substrate 100B can supply an appropriate voltage (or signal) to the newly mounted LCD panel. Furthermore, the addressing substrate 100B may also include some mechanism for changing the reference voltage or gray-scale voltage with a switch or volume, for example. Also, to make the same addressing substrate 100B compatible with multiple different types of display media, a plurality of γ correction programs may be prepared such that the user can select the best γ correction program or do fine adjustment on the currently selected program according to the type of the display medium chosen.

As described above, in the liquid crystal display device 100 of this preferred embodiment, the LCD panel 100A and the addressing substrate 100B are easily separable from each other. Thus, only one of these two members may be replaced with another one, while the other member may be used continuously. As a result, the production yield and/or recyclability of liquid crystal display devices can be increased. Also, depending on the intended application of the user, only the LCD panel 100A may be replaced. Furthermore, the LCD panel 100A may also be replaced with a different type of display panel (or display medium substrate) that uses any of various alternative display media including organic EL emission materials, electrophoretic materials and electrochromic materials. Accordingly, even a display medium with a relatively short life (e.g., an organic EL material) can be used efficiently, because only the display panel should be replaced.

In the preferred embodiment described above, the LCD panel 100A and the addressing substrate 100B are bonded together with an anisotropic conductive resin that can be peeled off easily afterward. However, the material for use to bond these two members together and the bonding structure thereof are not limited to this specific preferred embodiment. For example, the LCD panel 100A and the addressing substrate 100B may also be bonded together with an anisotropic conductive rubber sheet with tacky upper and lower surfaces. Alternatively, the LCD panel 100A and the addressing substrate 100B may also be magnetically attracted and secured to each other by providing a magnet for one of these two members and a ferromagnetic body of Ni, Fe or Co, for example, for the other, respectively. In that case, the first group of terminal electrodes 16 or pixel electrodes (or second group of terminal electrodes) 23 may be made of a ferromagnetic metal material.

Figure 2A:
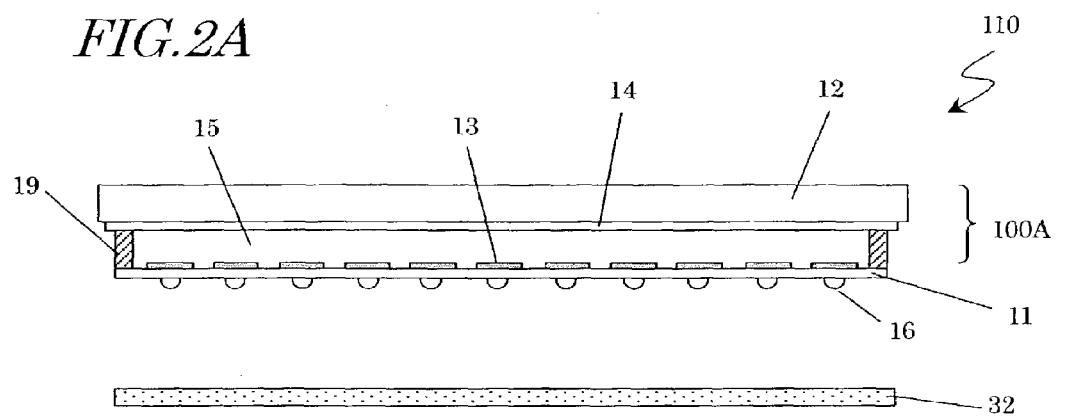
Figure 2B:
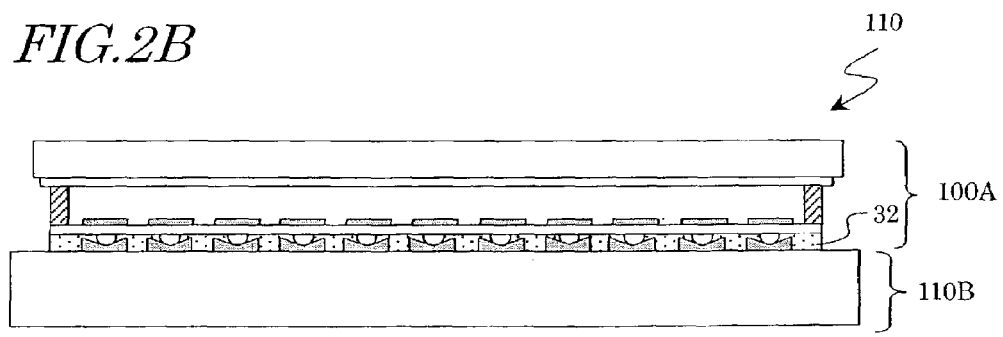

To align the LCD panel 100A with the addressing substrate 110B more easily, a liquid crystal display device 110 such as that shown in FIGS. 2A and 2B may also be used.

Unlike the liquid crystal display device 100 shown in FIGS. 1A, 1B and 1C, the liquid crystal display device 110 shown in FIGS. 2A and 2B has a structure in which the pixel electrodes (or second group of terminal electrodes) 23a of the addressing substrate 110B engage with the first group of terminal electrodes 16 of the LCD panel 100A. Specifically, the first group of terminal electrodes 16 is bump electrodes protruding from the back surface of the connector substrate 11, while the pixel electrodes (or second group of terminal electrodes) 23a have a concave shape to receive the first group of terminal electrodes 16 in the convex shape. More particularly, when the first group of terminal electrodes 16 is spherical bump electrodes, the pixel electrodes 23a preferably have a sloped upper surface that deepens toward its center as shown in FIG. 2A. This is because the first group of terminal electrodes 16 can be easily guided toward the center of their associated pixel electrodes 23a in that case.

It is naturally possible to form the first group of terminal electrodes 16 in a concave shape and the pixel electrodes 23a in a convex shape. Also, the first group of terminal electrodes 16 and the pixel electrodes 23a may have any other pair of shapes. The first group of terminal electrodes 16 and the pixel electrodes 23a may engage with each other particularly tightly depending on their specific shape combination. In that case, the anisotropic conductive layer 32 may be omitted.

Figure 3A:
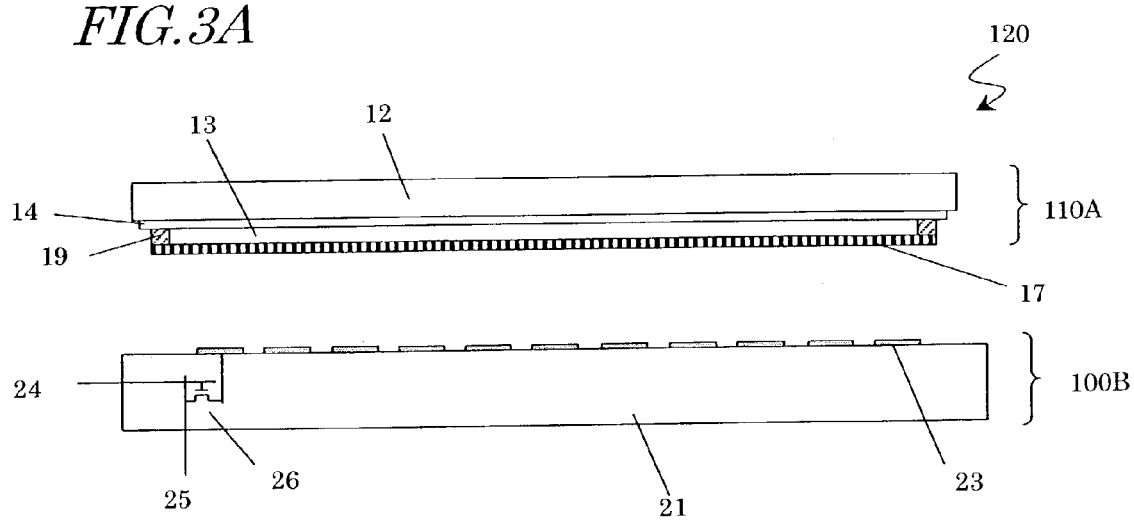
Figure 3B:
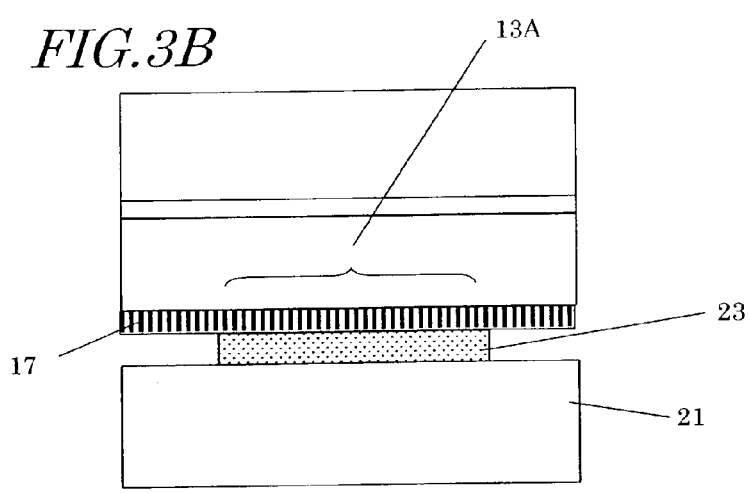
Figure 3C:
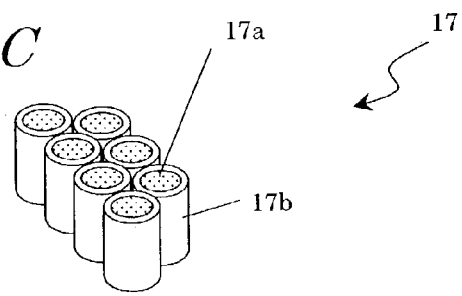

As another alternative, the connector substrate 11 may be replaced with an anisotropic conductive sheet 17 as in the liquid crystal display device 120 shown in FIGS. 3A, 3B and 3C. In that case, there is no need to align the LCD panel 110A with the addressing substrate 100B.

In the liquid crystal display device 120, the LCD panel 110A includes the anisotropic conductive sheet 17 instead of the connector substrate 11 of the liquid crystal display device 100. As shown in FIG. 3C, the anisotropic conductive sheet 17 is a sheet of an anisotropic conductive material in which the gaps between electrically conductive columns 17a of a metal material or a conductive resin are filled with an insulating layer 17b. Each of those electrically conductive columns 17a may have a diameter of about 20 μm and a height of about 150 μm, while the insulating layer 17b may have a thickness of about 1 μm to about 5 μm.

As shown in FIG. 3B, this anisotropic conductive sheet 17 is disposed so as to directly contact with the pixel electrodes 23 of the addressing substrate 100B. In this liquid crystal display device 120, those portions of the anisotropic conductive sheet 17, which contact with the pixel electrodes 23, function as the pixel electrodes 13 and the first group of terminal electrodes 16 of the LCD panel 100A. When this structure is adopted, there is no need to align the LCD panel 110A with the addressing substrate 100B, and the pixel electrodes 13 and the first group of terminal electrodes 16 shown in FIG. 1A may be omitted. Optionally, the anisotropic conductive layer 32 may be additionally used to bond the LCD panel 110A and the addressing substrate 100B together even more tightly.

When a substrate (or film) having a low mechanical strength is used (e.g., when the anisotropic conductive sheet 17 is used for this LCD panel 110A or when a polymer film is used as the connector substrate 11 of the LCD panel 100A), the liquid crystal material should be injected by a dripping technique or any other method that does not require a substrate having a high mechanical strength. A dripping method as disclosed in Japanese Patent Gazette for Opposition No. 8-20627 may be used, for example.

Hereinafter, another method of bonding the LCD panel 100A and the addressing substrate 100B shown in FIGS. 1A, 1B and 1C will be described with reference to FIGS. 4A and 4B. The following method is also applicable for use in the liquid crystal display device 110 shown in FIGS. 2A and 2B, the liquid crystal display device 120 shown in FIGS. 3A, 3B and 3C, an optical addressing type display device to be described later as a second specific preferred embodiment of the present invention, and an electronic appliance to be described later as a third specific preferred embodiment of the present invention.

Figure 4A:
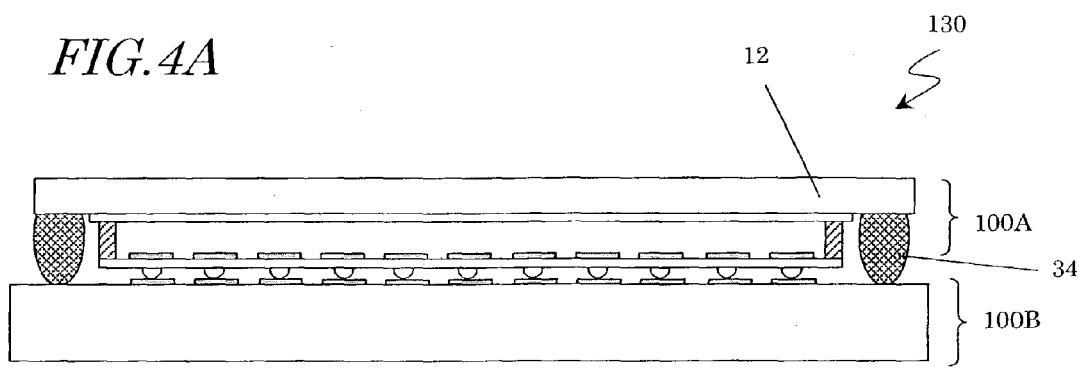
FIGS. 4A and 4B show another method of bonding the LCD panel 100A and addressing substrate 100B of the first preferred embodiment.
Figure 4B:
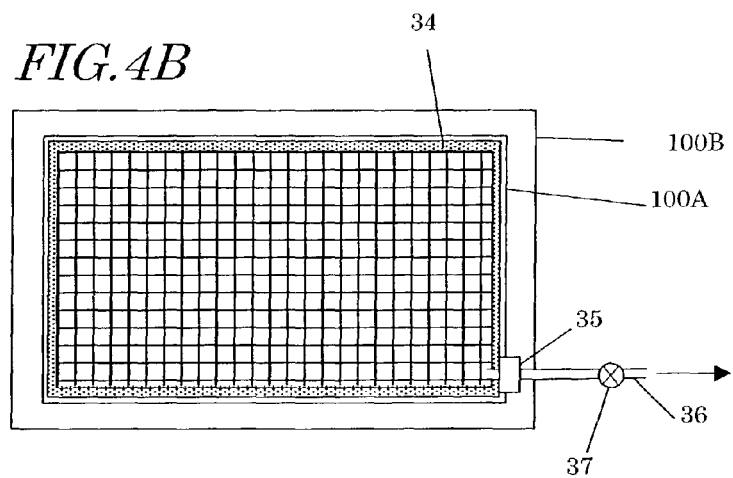

The liquid crystal display device 130 shown in FIGS. 4A and 4B further includes a seal member 34, which can maintain a reduced-pressure state in the gap between the LCD panel 100A and the addressing substrate 100B. When the reduced-pressure state is maintained in the gap between the LCD panel 100A and the addressing substrate 100B, the atmospheric pressure will be uniformly applied to the entire surface of the LCD panel 100A and addressing substrate 100B. Thus, a good electrical connection is realized. When such a structure is adopted, the LCD panel 100A can be easily attached or removed. Accordingly, the user may replace the LCD panel 100A any time to satisfy his or her needs.

This liquid crystal display device 130 may be fabricated as shown in FIG. 4B, for example.

First, the seal member 34 is formed to seal up the gap between the LCD panel 100A and the addressing substrate 100B. This seal member 34 may be made of a silicone rubber, for example. The reduced-pressure state may be created in the gap by inserting an exhaust tube 36 into the seal member 34 by way of an openable and closable zipper 35 and by evacuating the inside of the seal member 34, i.e., the gap between the LCD panel 100A and the addressing substrate 100B, with a pump or an ejector. To increase the work efficiency, the exhaust tube 36 may be provided with a valve 37. When the pressure in the gap between the LCD panel 100A and the addressing substrate 100B has been sufficiently reduced, the zipper 35 will be closed to maintain the reduced-pressure state.

If the liquid crystal display device 130 needs to exhibit increased mechanical strength, the opening of the seal member 34 may be further sealed up with a sealing agent (or an adhesive). Alternatively, another seal member may be provided so as to surround the LCD panel 100A and addressing substrate 100B. Such a reduced-pressure state may also be created in the gap between the LCD panel 100A and the addressing substrate 100B by the method disclosed in Japanese Laid-Open Publication No. 4-291320 or No. 2000-275656, for example.

Embodiment 2

Figure 5A:
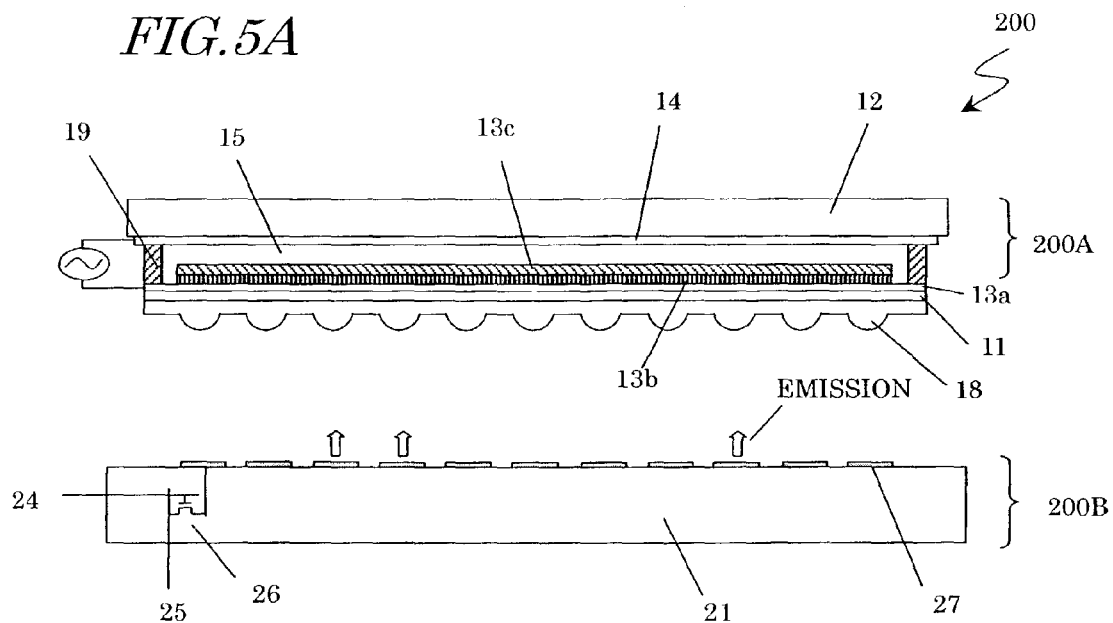
FIG. 5A is an exploded cross-sectional view of an optical addressing type liquid crystal display device 200 according to a second specific preferred embodiment of the present invention.

Hereinafter, a second specific preferred embodiment of the present invention will be described. A display device according to this second preferred embodiment is an optical addressing type display device. FIG. 5A is an exploded cross-sectional view of a liquid crystal display device 200 according to the second preferred embodiment of the present invention.

As shown in FIG. 5A, the liquid crystal display device 200 includes an LCD panel 200A as an exemplary display medium substrate and an optical addressing substrate 200B.

The LCD panel 200A includes the connector substrate 11, counter substrate 12, and liquid crystal layer 15, which is sandwiched between the connector substrate 11 and counter substrate 12. The liquid crystal layer 15 is sealed with the seal member 19. The connector substrate 11 and counter substrate 12 are insulating substrates such as glass substrates or plastic substrates.

The liquid crystal layer 15 is interposed between an electrode 13a on the connector substrate 11 and an electrode 14 on the counter substrate 12. A photo-conductive layer 13b is provided between the electrode 13a and the liquid crystal layer 15. A reflective layer 13c is provided between the photo-conductive layer 13b and the liquid crystal layer 15. An AC voltage can be applied between the electrodes 13a and 14. The reflective layer 13c is provided to reflect the externally incoming light, which has entered the liquid crystal layer 15, back toward the viewer (i.e., toward the counter substrate 12). The photo-conductive layer 13b may be made of Si or an organic semiconductor. The reflective layer 13c may be a dielectric mirror, for example.

Depending on the wavelength of the light for use in optical addressing or the spectral sensitivity of the photo-conductive layer 13b, the reflective layer 13c may be omitted to make the photo-conductive layer 13b function as an alternative reflective layer. The reflective layer 13c may also be omitted when a display medium layer exhibiting reflection properties by itself (e.g., a toner display medium, an electrophoretic display medium or a twisted ball display medium) is used in place of the liquid crystal layer 15 or when a self-emitting display medium layer such as an EL layer is used.

As shown in FIG. 5A, the optical addressing substrate 200B includes the gate lines 24, source lines 25, TFTs 26 and light-emitting elements 27 on the substrate 21. Each of the light-emitting elements 27 is connected to its associated source line 25 by way of its associated TFT 26. The light-emitting elements 27 may be covered with a passivation film or substrate (not shown). The substrate 21 may be either an insulating substrate (such as a glass substrate or plastic substrate) or semiconductor substrate (such as a silicon substrate). The gate lines 24 and source lines 25 may be formed by patterning a metal film of Al, Ta, Mo or Cu or a conductive oxide film such as an ITO film. Examples of preferred light-emitting elements 27 include organic or inorganic EL elements, light emitting diodes (LEDs) and field emission displays (FEDs).

When the gate lines 24 are sequentially activated by supplying a gate signal through one gate line 24 after another and a data signal through one source line 25 after another synchronously with each other, the light-emitting elements 27 emit light one after another. It should be noted that matrix type light-emitting devices (e.g., plasma emission devices or EL devices) that use no switching elements such as the TFTs 26 may also be used as the light-emitting elements 27. Although a line sequential addressing scheme will be explained in the following example, a dot sequential addressing scheme or a field sequential addressing scheme may also be used.

The LCD panel 200A and the optical addressing substrate 200B may be bonded together with a transparent adhesive layer or pressure-sensitive adhesive layer (not shown). To make the LCD panel 200A removable easily, the pressure-sensitive adhesive layer is preferred. On the other hand, the adhesive layer is preferably made of a thermoplastic resin that softens when heated or a UV decomposing resin that loses its adhesive strength when exposed to an ultraviolet ray. Alternatively, the LCD panel 200A and the optical addressing substrate 200B may also be bonded together with the seal member 34 shown in FIG. 4A such that a reduced-pressure state is created in the gap between the LCD panel 200A and the optical addressing substrate 200B.

On receiving the light that has been emitted from the light-emitting elements 27 of the optical addressing substrate 200B, the photo-conductive layer 13b of the LCD panel 200A generates optically excited electric charges (i.e., electron-hole pairs) to decrease its electrical resistance (or impedance) value. Accordingly, when the light enters the photo-conductive layer 13b while a predetermined voltage is applied between the electrodes 13a and 14 of the LCD panel 200A, the electrical resistance (or impedance) value of the photo-conductive layer 13b decreases only in its portions that the light has entered. As a result, an increased voltage is applied to the liquid crystal layer 15 in those portions. On the other hand, the other portions of the photo-conductive layer 13b that have been exposed to no light have a high electrical resistance (or impedance) value. Thus, almost no voltage is applied to the liquid crystal layer 15 in those portions. By utilizing this principle, each predetermined portion of the liquid crystal layer 15 may be sequentially addressed with the light that has gone out of the optical addressing substrate 200B, and a display operation may be conducted in accordance with the voltage to be applied from the electrodes 13a and 14 to the liquid crystal layer 15.

It should be noted that a so-called "crosstalk" phenomenon, in which not only the predetermined portion (typically a pixel) but also other portions are addressed unintentionally, may occur depending on the distribution of the light that has been emitted from the light-emitting elements 27 of the optical addressing substrate 200B (i.e., the angular distribution of emission intensity). Thus, if the distribution of the light that has been emitted from the light-emitting elements 27 is too broad, an optical system needs to be provided to control the distribution of light in such a manner that no crosstalk will occur (i.e., such that the light shall enter only the predetermined portion of the photo-conductive layer 13b).

For example, as in the liquid crystal display device 200 shown in FIG. 5A, a lens array 18 for controlling the distribution of the light may be provided between the LCD panel 200A and the optical addressing substrate 200B. The lens array 18 may be naturally replaced with a pin hole array. The pin hole array may be made of a black resin, which is normally used to make a black matrix, on the back surface of the connector substrate 11. It should be noted that if the light-emitting elements 27 are arranged in stripes in the column or row direction to address either columns of pixels or rows of pixels sequentially, then a lens having the function of focusing the light in the width direction or linear slits may be provided.

In this preferred embodiment, the light to enter the photo-conductive layer 13b has only to have an intensity that is high enough to change the electrical resistance (or impedance) of the photo-conductive layer 13b. Accordingly, the light may have a relatively low intensity. Also, to minimize the crosstalk phenomenon, the photo-conductive layer 13b may be divided into the same number of portions as the pixels. Alternatively, a conductive layer may be additionally provided between the photo-conductive layer 13b and the liquid crystal layer 15 and may be divided into the same number of portions as the pixels. In such a configuration, even if each unit region of the photo-conductive layer 13b, which changes its conductivity responsive to the addressing light, is smaller than a pixel, a predetermined voltage can still be applied to the conductive layer that is provided so as to face the pixels. Optionally, this conductive layer may function as a reflective layer.

As described above, according to this optical addressing technique, the LCD panel and the addressing substrate can be connected together more easily than the electrical addressing technique of the first preferred embodiment. Thus, defects, which would otherwise be caused due to bad connections, can be almost eliminated.

Also, if the light-emitting elements 27 of the optical addressing substrate 200B emit visible radiation and are arranged in matrix, then the optical addressing substrate 200B may be used as a self-emitting display separately from the LCD panel 200A. Accordingly, in a relatively dark operating environment (e.g., indoors), only the optical addressing substrate 200B may be used separately as a self-emitting display. On the other hand, in a relatively bright operating environment (e.g., outdoors), a reflection display mode LCD panel 200A may be mounted onto the optical addressing substrate 200B and may be used as a reflective display panel. In this manner, the liquid crystal display device 200 of this preferred embodiment can switch the modes of display according to the operating environment or demand of the user (or viewer).

The LCD panel 200A shown in FIG. 5A uses the light that has gone out of the optical addressing substrate 200B as the addressing light only. However, when the optical addressing substrate 200B emitting visible radiation and the LCD panel 210A shown in FIG. 5B are used in combination, the light that has gone out of the optical addressing substrate 200B may be used not merely as the addressing light but also as light for display.

The LCD panel 210A is a so-called "reflective and transmissive" LCD panel, and includes a transmitting portion T to conduct a display operation in a transmission mode and a reflecting portion R to conduct a display operation in a reflection mode. In this LCD panel 210A, the electrode 13a', photo-conductive layer 13b' and reflective layer 13c' are selectively provided only for the reflecting portion R, but not provided for the transmitting region T. As in the liquid crystal display device 200 shown in FIG. 5A, the reflecting portion R is addressed with the light that has been emitted from the light-emitting elements 27 and conducts a display operation in a reflection mode. In the transmitting portion T on the other hand, no voltage is applied to the liquid crystal layer 15 and a display operation is conducted by transmitting the light that has been emitted from the light-emitting elements 27. That is to say, that portion of the liquid crystal layer 15 (and polarizer (not shown)) is designed so as to conduct a display operation in a normally white mode.

Figure 5B:
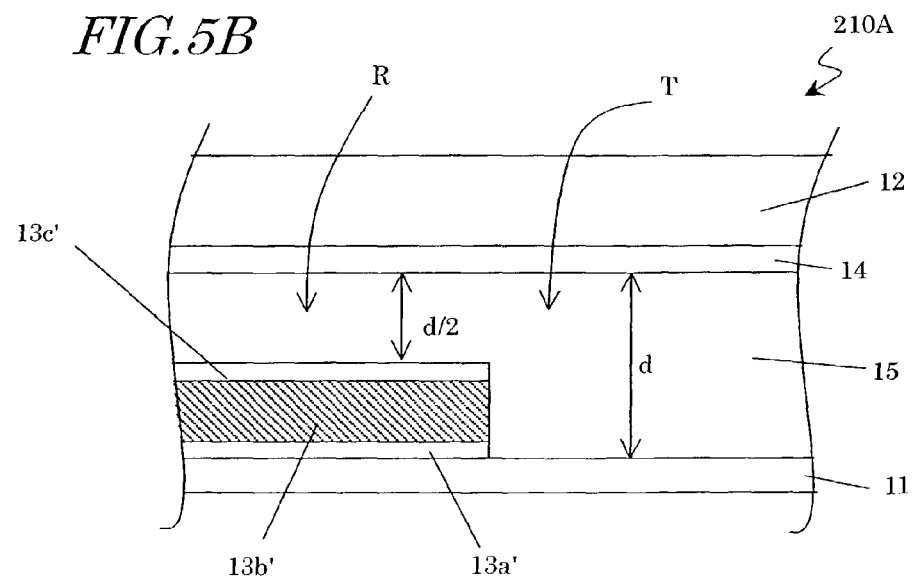
FIG. 5B is a cross-sectional view illustrating one pixel portion of another LCD panel 210A for use in the liquid crystal display device 200.

To optimize both the reflection mode display and the transmission mode display alike, the thickness of the liquid crystal layer 15 in the reflecting portion R is preferably half of the thickness d of the liquid crystal layer 15 in the transmitting portion T as shown in FIG. 5B. In this preferred embodiment, each pixel includes the transmitting portion T and the reflecting portion R. However, the present invention is in no way limited to this specific preferred embodiment. Alternatively, any other known reflective and transmissive LCD panel may also be used instead.

The LCD panel 200A or 210A and the optical addressing substrate 200B may be bonded together as in the first preferred embodiment described above. However, when an adhesive layer or a pressure-sensitive adhesive layer is used, the adhesive layer does not have to be electrically conductive but needs to be transparent. Naturally, the arrangement shown in FIG. 4A may be used or the LCD panel 200A or 210A and the optical addressing substrate 200B may also be magnetically attracted to each other with a magnet, for example.

The second preferred embodiment of the present invention described above also uses an LCD panel as a display medium substrate. Alternatively, a display panel, which uses any of various other display media such as organic EL emission materials, electrophoretic materials and electrochromic materials, may also be used as well.

Embodiment 3

Hereinafter, a third specific preferred embodiment of the present invention will be described. The third preferred embodiment relates to a sensor.

Figure 6A:
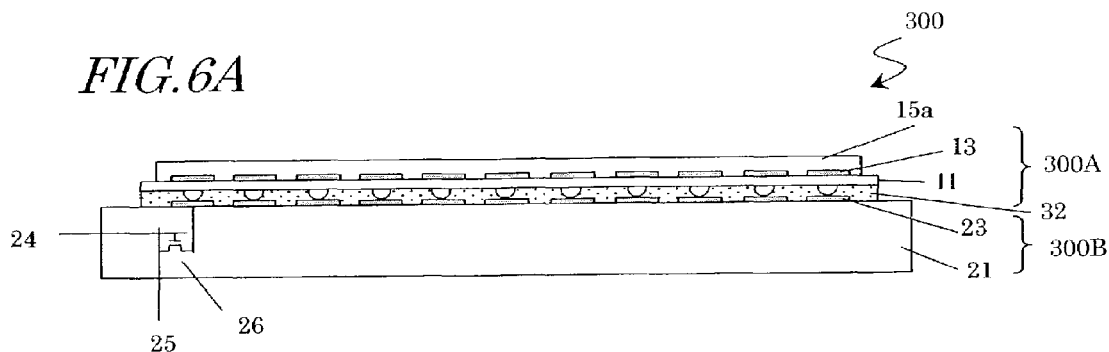

The structure and function of a sensor 300, including an array of sensing elements instead of the display panel according to any of the preferred embodiments described above, will be described with reference to FIGS. 6A, 6B and 6C.

The sensor 300 includes an array of sensing elements 300A and an addressing substrate 300B. The addressing substrate 300B may have the same configuration as the addressing substrate 100B or 110B for use in the display device of the first preferred embodiment. The array of sensing elements 300A includes a connector substrate 11, multiple sensor electrodes 13 that are arranged in matrix on the connector substrate 11, and an insulating layer (or protective coating) 15a that covers the sensor electrodes 13. The array of sensing elements 300A and the addressing substrate 300B may be bonded together with the anisotropic conductive layer 32 as in the first preferred embodiment described above.

Figure 6B:
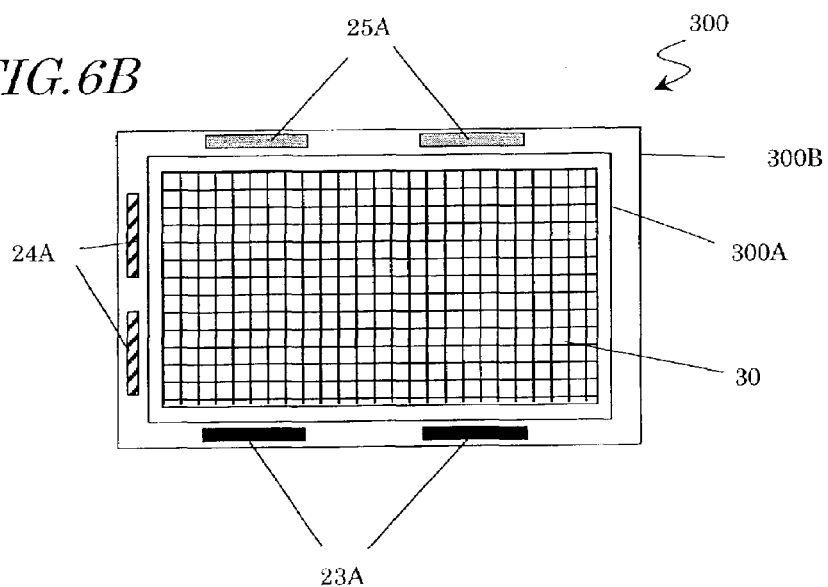
Figure 6C:
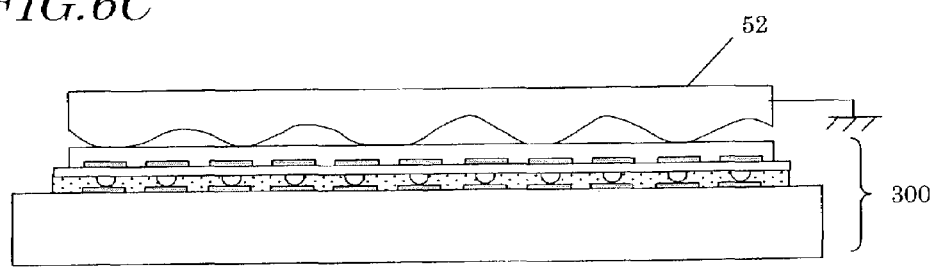

The operating principle of the sensor 300 will be described with reference to FIG. 6C.

First, an object 52 with an uneven surface (e.g., a human finger) is brought into contact with the upper surface of the array of sensing elements 300A (i.e., onto the insulating layer 15a). In this case, the object 52 is regarded as a sort of electrode, and a capacitance is formed between the object 52 and the sensor electrodes 13.

Only the insulating layer 15a is present between a convex portion on the uneven surface of the object 52 and a sensor electrode 13. On the other hand, not only the insulating layer 15a but also an air gap are present between a concave portion on the uneven surface of the object 52 and a sensor electrode 13. Thus, the value of a capacitance (i.e., a charge quantity) to be sensed by the former sensor electrode 13 under the convex portion of the object 52 is different from that of a capacitance to be sensed by the latter sensor electrode 13 under the concave portion of the object 52. The distribution of these capacitance values is read by a charge detector (or voltage detector) 23A, which is provided at one end of the source lines 25 on the addressing substrate 300B as shown in FIG. 6B, while an addressing operation is being carried out by the addressing substrate 300B. In this manner, the surface shape (or distribution of concave and convex portions) of the object 52 can be sensed. Thus, the sensor 300 may be used as an input device (e.g., fingerprint sensor).

As shown in FIG. 6B, the addressing substrate 300B includes a gate line driver 24A to supply a gate signal through the gate lines 24, a source line driver 25 to supply a data signal through the source lines 25, and the charge detector (or voltage detector) 23A. Except the charge detector 23A, the addressing substrate 300B has substantially the same configuration as the addressing substrate 100B or 110B of the first preferred embodiment described above. Accordingly, just by substituting the array of sensing elements 300A for the display panel 100A of the first preferred embodiment, the display device may be switched into a sensor. This switching should be carried out such that the source line driver 25A of the addressing substrate 300B is used to make the assembly function as a display device and that the charge detector (or voltage detector) 23A of the addressing substrate 300B is used to make the assembly function as a sensor.

The addressing substrate of the first or third preferred embodiment described above may function as an array of photosensors.

If the TFTs 26 of the addressing substrate include a semiconductor layer for use to perform electrical switching and a semiconductor layer of which the conductivity changes upon the exposure to light, then the addressing substrate may be operated as an array of photosensors as disclosed in Japanese Patent No. 2796336 or No. 3019632.

Figure 7:
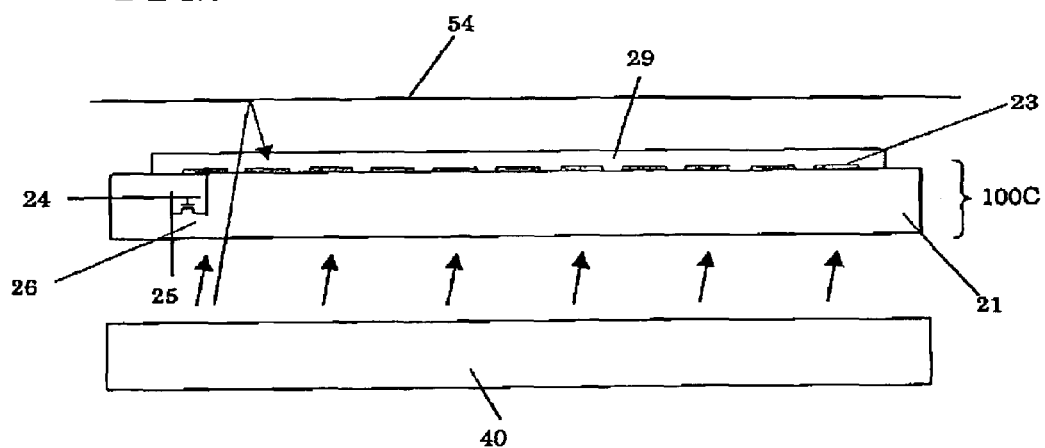
FIG. 7 shows how an alternative addressing substrate 100C may be used in a display device or a sensor according to a preferred embodiment of the present invention.

Such an addressing substrate 100C may be used as a close-contact image sensor as shown in FIG. 7.

As shown in FIG. 7, a backlight 40 is disposed behind the addressing substrate 100C and a manuscript 54 is positioned such that the printed side thereof is opposed to the upper surface of the addressing substrate 100C. The light that has been emitted from the backlight 40 is transmitted through the addressing substrate 100C, incident onto the printed side of the manuscript 54, and then reflected from, or absorbed into, the printed side depending on the surface state thereof. The light that has been reflected from the printed side of the manuscript 54 enters a TFT 26. In accordance with the intensity of the incident light, the TFT 26 changes its conductivity, thereby generating a signal representing the intensity of the incident light. In this manner, the recorded information can be read out from the printed side of the manuscript 54. Naturally, the addressing substrate 100C needs to include a circuit for reading such a signal, which may be any known circuit.

If the TFTs 26 have such a structure, the addressing substrate can be separated from the display device of the first preferred embodiment or the sensor of the third preferred embodiment and may be used as an array of photosensors.

In the first and third preferred embodiments described above, the addressing substrate includes the TFTs 26 as its switching elements. However, the switching elements are not limited to TFTs but may be MIMs or any other type of switching elements. Also, the switching elements are arranged in matrix in the preferred embodiments described above, but are not limited to such an arrangement.

According to various preferred embodiments of the present invention described above, the addressing substrate can be easily separated from the array of elements. Thus, the production yield and/or recyclability of electronic appliances can be increased.

Preferred embodiments of the present invention also provide alternative methods of using an electronic appliance by changing the combination of an array of elements and an addressing substrate or by using either the array of elements or the addressing substrate separately.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. An electronic appliance comprising
an array of elements and
an addressing substrate,
wherein the array of elements includes:
a first surface and a second surface, which are opposed to each other;
element regions, which are arranged in a matrix between the first and second surfaces and which include electrodes; and
a first group of terminal electrodes, which is provided on the second surface and each of which is electrically connected to an associated one of the electrodes,
wherein the addressing substrate includes:
a substrate, which has a third surface opposed to the second surface of the array of elements;
a second group of terminal electrodes, which is provided on the third surface and each of which is electrically connected to an associated one of the terminal electrodes in the first group; and
an addressing driver, which transmits or receives a predetermined signal to/from the element regions by way of the second group of terminal electrodes while addressing the element regions one after another, and
wherein an anisotropic conductive layer is provided between the first and second groups of terminal electrodes.

2. The electronic appliance of claim 1, wherein the array of elements is attachable to, and removable from, the addressing substrate.

3. An electronic appliance comprising
an array of elements and
an addressing substrate,
wherein the array of elements includes:
a first surface and a second surface, which are opposed to each other;
element regions, which are arranged in a matrix between the first and second surfaces and which include electrodes; and
a first group of terminal electrodes, which is provided on the second surface and each of which is electrically connected to an associated one of the electrodes,
wherein the addressing substrate includes:
a substrate, which has a third surface opposed to the second surface of the array of elements;
a second group of terminal electrodes, which is provided on the third surface and each of which is electrically connected to an associated one of the terminal electrodes in the first group; and
an addressing driver, which transmits or receives a predetermined signal to/from the element regions by way of the second group of terminal electrodes while addressing the element regions one after another,
wherein the second surface is defined by an anisotropic conductive layer, and
wherein portions of the anisotropic conductive layer function as the electrodes and as the first group of terminal electrodes.

4. The electronic appliance of claim 1, wherein the first and second groups of terminal electrodes have mutually engaging structures.

5. The electronic appliance of claim 1, further comprising a seal member to maintain a reduced-pressure state in a gap between the array of elements and the addressing substrate.

6. The electronic appliance of claim 1, wherein the element regions are pixels, and
wherein the electrodes are pixel electrodes that are arranged in a matrix, and
wherein the first and second groups of terminal electrodes are each arranged in the same matrix as the pixel electrodes, and
wherein the array of elements functions as a display device in response to the predetermined signal to be transmitted from the addressing driver.

7. The electronic appliance of claim 6, wherein the addressing substrate includes a circuit for generating multiple reference voltages and multiple gray-scale voltages associated with the reference voltages.

8. The electronic appliance of claim 6, wherein the addressing substrate includes a plurality of switching elements, each of which is connected to an associated one of the terminal electrodes in the second group.

9. The electronic appliance of claim 6, wherein the pixels include a liquid crystal layer.

10. The electronic appliance of claim 6, wherein the pixels include an organic EL emission layer.

11. The electronic appliance of claim 6, wherein the addressing substrate includes a plurality of switching elements, each of which is connected to an associated one of the terminal electrodes in the second group, and
wherein each said switching element includes a semiconductor layer that changes the conductivity thereof when exposed to light, and
wherein the addressing substrate is operable as an array of photosensors separately from the array of elements.

12. The electronic appliance of claim 1, wherein the element regions include the electrodes and an insulating layer that covers the electrodes, and form a capacitance between the electrodes and an object that is located over the electrodes with the insulating layer interposed between them, and
wherein the array of elements functions as an array of capacitance sensors for transferring electric charge, which has been stored on the electrodes, to the addressing substrate in response to the signal that has been transmitted from the addressing substrate.

13. The electronic appliance of claim 12, wherein the electrodes are arranged in a matrix, and
wherein the first and second groups of terminal electrodes are each arranged in the same matrix as the electrodes, and
wherein the addressing substrate includes a plurality of switching elements, each of which is connected to an associated one of the terminal electrodes in the second group.

14. The electronic appliance of claim 13, wherein each said switching element includes a semiconductor layer that changes the conductivity thereof when exposed to light, and
wherein the addressing substrate is operable as an array of photosensors separately from the array of elements.

15. An electronic appliance comprising:
a counter substrate and a connector substrate spaced apart from each other with a liquid crystal layer disposed in the space therebetween, the connector substrate including pixel electrodes formed on one side thereof and terminal electrodes formed on the other side thereof, each of the terminal electrodes being electrically connected to a corresponding one of the pixel electrodes through a hole formed in the connector substrate;

an addressing substrate for addressing the pixel electrodes, the addressing substrate including switching elements connected to gate lines and source lines, and terminal electrodes each of which is connected to a corresponding one of the switching elements, wherein the terminal electrodes of the connector substrate are electrically connected to the terminal electrodes of the addressing substrate so that the addressing circuitry can address the pixel electrodes, and wherein the terminal electrodes of the addressing substrate are electrically connected to the terminal electrodes of the connector substrate through an anisotropic conductive layer that exhibits conductivity only perpendicularly to its major surfaces.

16. The electronic appliance of claim 15, wherein the anisotropic conductive layer comprises a material having an adhesive property that is changeable under one or more conditions to permit separation of the terminal electrodes of the connector substrate and the terminal electrodes of the addressing substrate.

17. The electronic appliance of claim 15, wherein the terminal electrodes of the addressing substrate have one or the other of a convex and a concave shape and the terminal electrodes of the connector substrate have the other of the convex and the concave shape.

18. The electronic appliance of claim 15, further comprising a seal member arranged between the counter substrate and the addressing substrate to provide a reduced-pressure gap in the space therebetween.

19. An electronic appliance comprising:

a counter substrate and an anisotropic conductive sheet that is electrically conductive only in a direction perpendicular to its major surfaces, the counter substrate and the anisotropic conductive sheet being spaced apart with a liquid crystal material disposed therebetween;

an addressing substrate including switching elements connected to gate lines and source lines, and terminal electrodes each of which is connected to a corresponding one of the switching elements, wherein the terminal electrodes are electrically connected to the anisotropic conductive sheet so that the addressing circuitry can apply voltages to the liquid crystal material by applying signals to the terminal electrodes.

20. The electronic appliance of claim 19, wherein the anisotropic conductive sheet comprises electrically conductive columns.

* * * * *